United States Patent [19]

Manley

[11] Patent Number: 5,415,754
[45] Date of Patent: May 16, 1995

[54] METHOD AND APPARATUS FOR SPUTTERING MAGNETIC TARGET MATERIALS

[75] Inventor: Barry W. Manley, Boulder, Colo.

[73] Assignee: Sierra Applied Sciences, Inc., Boulder, Colo.

[21] Appl. No.: 142,162

[22] Filed: Oct. 22, 1993

[51] Int. Cl.⁶ .............................................. C23C 14/34
[52] U.S. Cl. ............................ 204/192.12; 204/298.16; 204/298.19
[58] Field of Search ...................... 204/192.12, 298.18, 204/298.19, 298.16, 298.12

[56] References Cited

U.S. PATENT DOCUMENTS

| | | |
|---|---|---|
| 4,865,708 | 9/1989 | Welty .......................... 204/298.19 X |
| 4,964,968 | 10/1990 | Arita ............................... 204/298.19 |
| 5,262,028 | 11/1993 | Manley ....................... 204/298.19 X |

Primary Examiner—Nam Nguyen
Attorney, Agent, or Firm—Bruce E. Dahl

[57] ABSTRACT

A sputtering magnet assembly generates a magnetic field having sufficient strength to produce a plasma-confining magnetic tunnel over the front surface of a magnetic target. A magnetic shunt positioned a spaced distance from the back surface of the magnetic target provides an alternate path for excess magnetic flux liberated by erosion of the target. The alternate path provided by the magnetic shunt has a lower magnetic resistance than most paths that exit the front surface of the target, pass into the sputtering region, and re-enter the front surface of the target. Accordingly, most of the excess magnetic flux is prevented from escaping into the sputtering region.

14 Claims, 14 Drawing Sheets

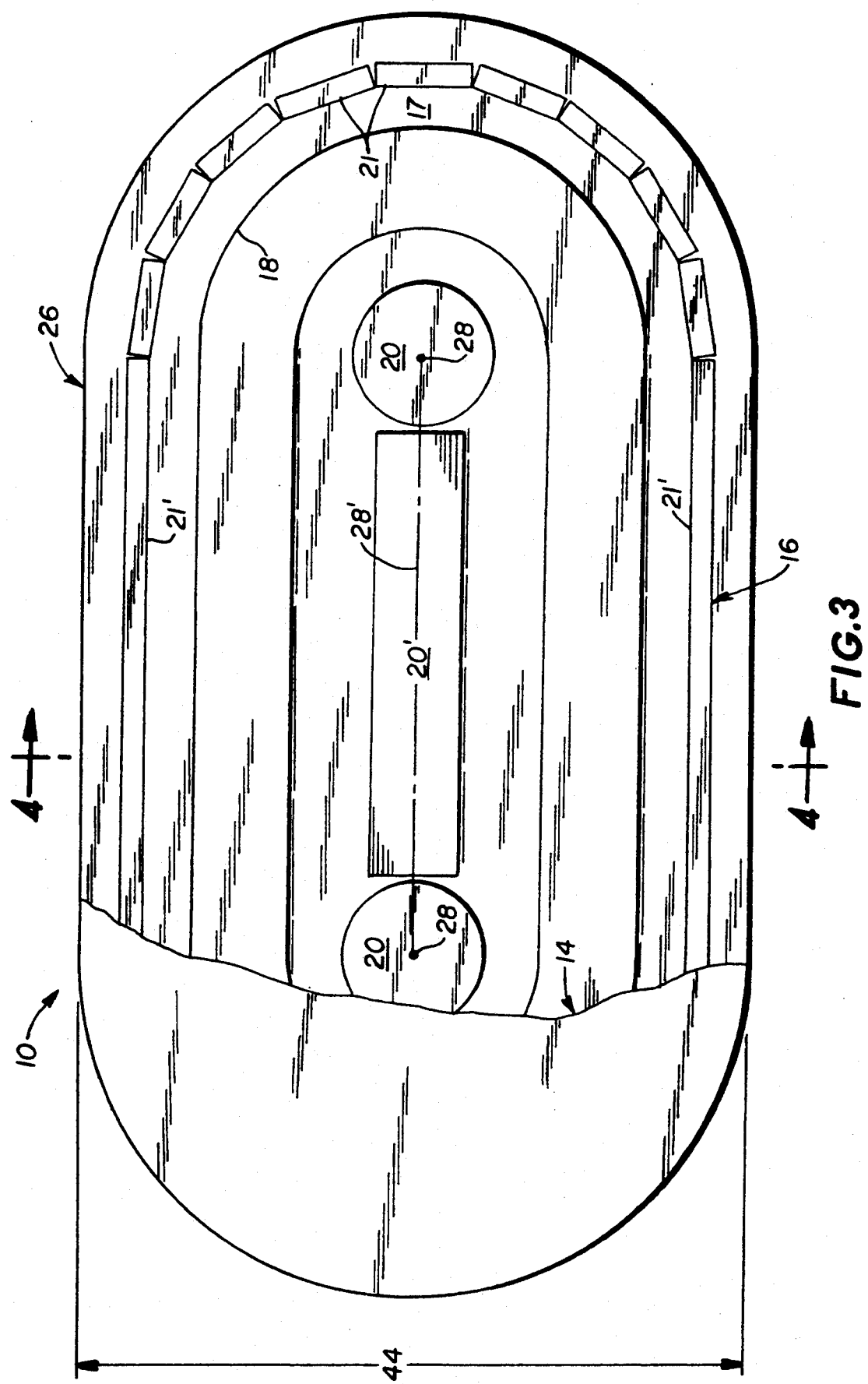

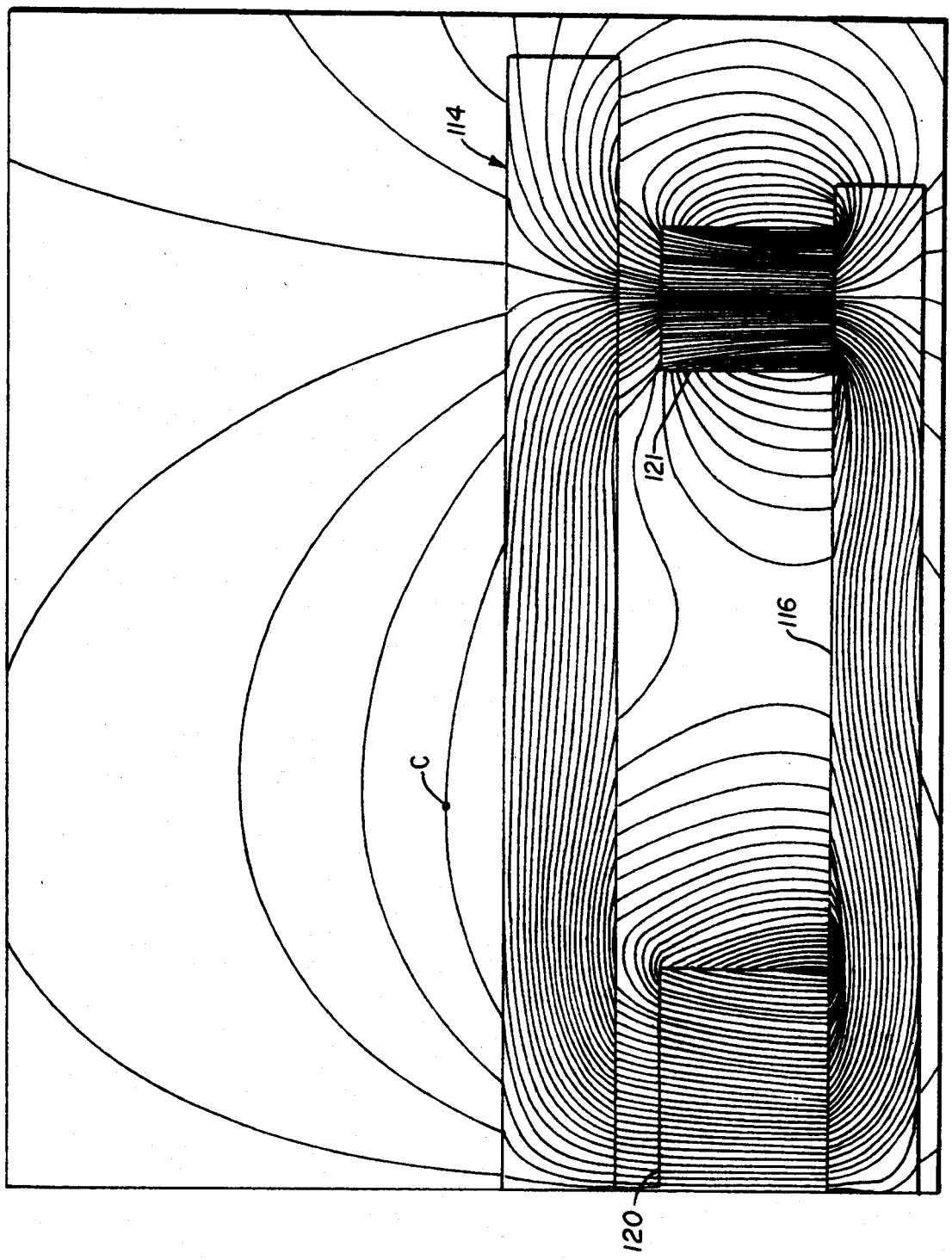

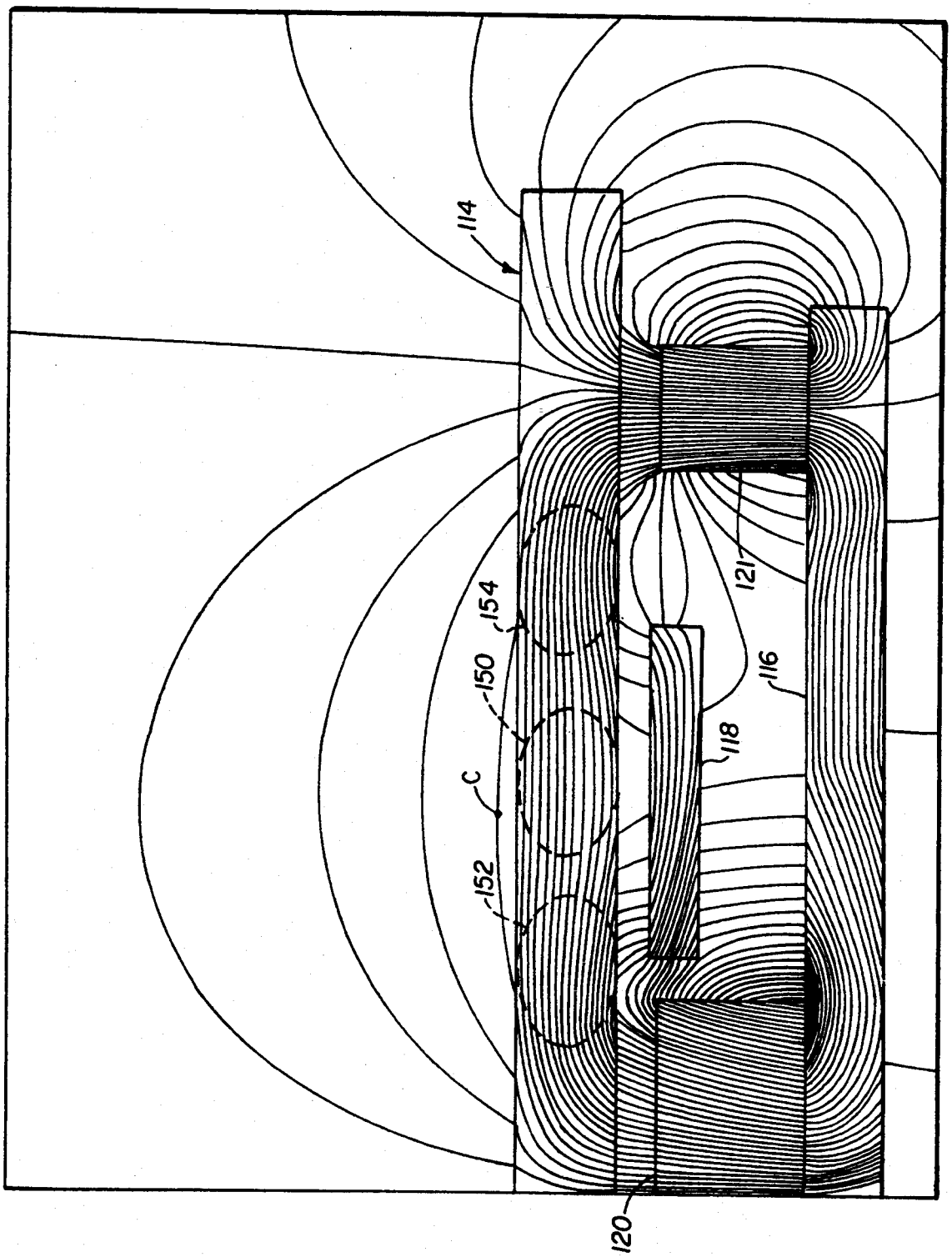

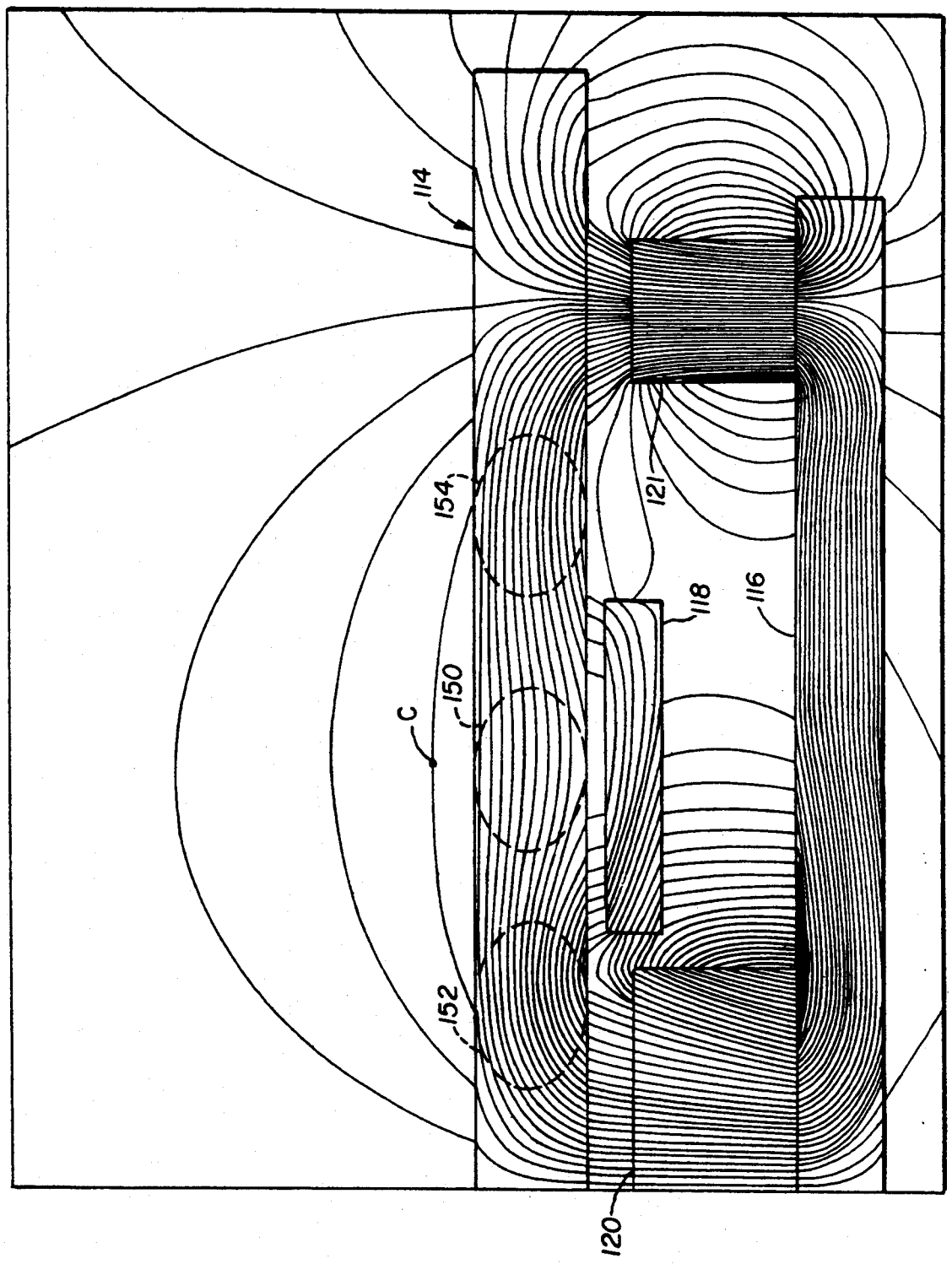

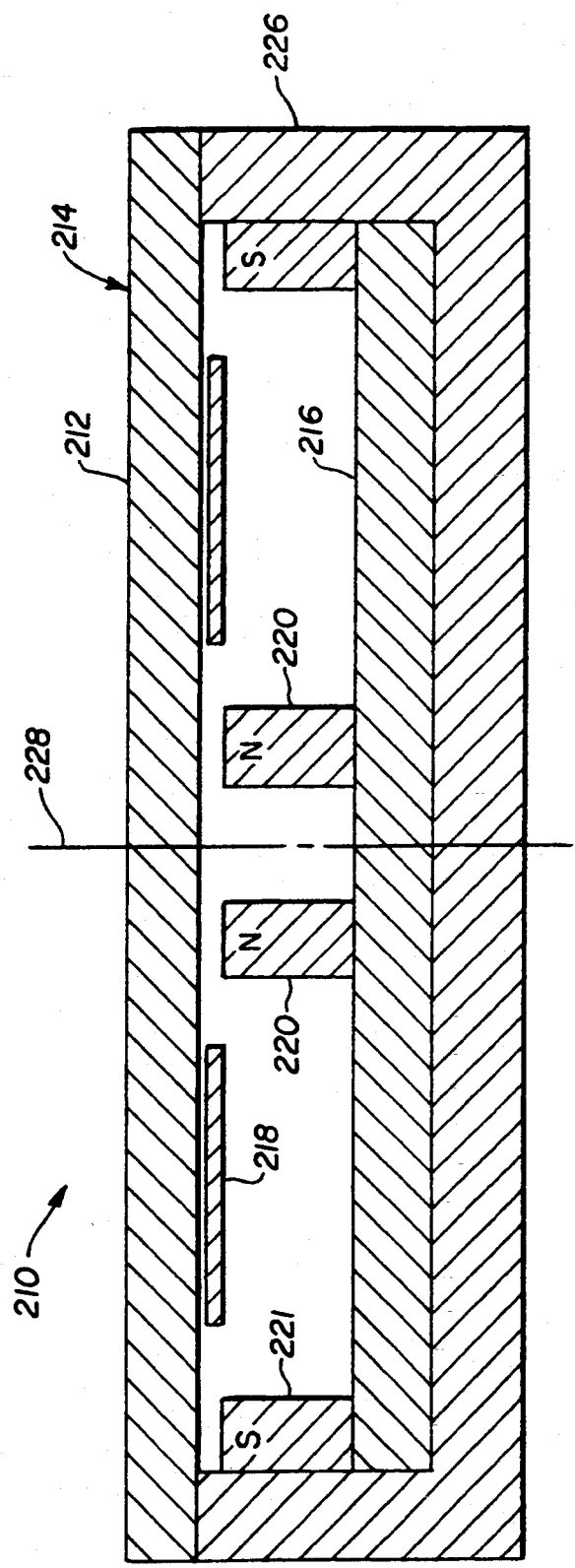

METHOD AND APPARATUS FOR SPUTTERING MAGNETIC TARGET MATERIALS

BACKGROUND OF THE INVENTION

1. Field of the Invention

This invention relates generally to the field of magnetron sputtering and more specifically to planar magnetron sputtering apparatus for sputtering magnetic target materials.

2. Background of the Invention

Glow discharge sputtering is a well-known process that is widely used to deposit thin films of various kinds of ceramic and metallic materials onto the surfaces of objects. For example, glow discharge sputtering is commonly used in the electronics industry to produce integrated circuit semiconductors and photovoltaic cells, as well as the magnetic tapes and disks used in audio, video, and computer applications. Sputtering is also used to deposit coatings on architectural glass, computer screens, sheet metal, sunglasses, automobile parts, automobile glazing, surgical implants, jewelry, tool bits, sheet plastic, fabrics, and fiber optics, just to name a few.

One type of glow discharge sputtering is diode sputtering. Diode sputtering is usually conducted in a vacuum chamber and in the presence of an inert sputtering gas, such as argon, that is maintained under very low pressure. The material to be sputtered (usually referred to as the target) is connected to the negative terminal of a DC power supply and serves as a cathode. The positive terminal of the power supply may be connected to a separate anode structure or to the vacuum chamber itself, depending on the application. The strong electric field between the target/cathode and the anode ionizes the sputtering gas, producing a glow discharge. Since the target/cathode is held at a strong negative potential, the positive ions from the glow discharge bombard the target material and eject target atoms, which then deposit on a work-piece or a substrate placed generally in line of sight of the target. Unfortunately, however, the diode sputtering process is slow and relatively inefficient compared to other film deposition techniques.

The efficiency of the diode sputtering process has been significantly increased by using a magnetic field to confine the glow discharge to the immediate vicinity of the target surface. Basically, while the sputtering yield (i.e., the number of target atoms dislodged or sputtered per incident ion) depends on the energies of the incident ions, the overall sputtering rate depends on both the energies of the incident ions as well as the total number of ions that bombard the target surface during a given time. Therefore, the sputtering rate can be increased by using a magnetic field to confine the ions and electrons produced in the glow discharge to the region immediately adjacent the surface of the target. The presence of such a plasma-confining magnetic field also has other benefits, such as allowing the sputtering operation to be conducted at lower gas pressures, confining the glow discharge to the neighborhood of the electrodes, and reducing electron bombardment of the substrates.

A common type of magnetic sputtering device is the planar magnetron, so named because the target is in the form of a flat circular or rectangular plate. Powerful magnets placed behind the target plate produce a strong plasma-confining magnetic field adjacent the front surface of the target, thus greatly increasing sputtering efficiency. While numerous shapes and configurations of plasma-confining magnetic fields exist, it is common to shape the plasma-confining magnetic field so that it forms a closed loop ring or "racetrack" over the surface of the target material. When viewed in cross-section, the flux lines of the magnetic field loop or arch over the surface of the target, forming a magnetic "tunnel," which confines the glow discharge to a ring or racetrack shaped sputtering region next to the front surface of the target. As is well-known, the electric field created by the high voltage between an anode and the target/cathode acting in combination with the closed loop magnetic field causes electrons within the glow discharge to gain a net velocity along the racetrack, with the magnitude and direction of the electron velocity vector being given by the vector cross product of the electric field vector E and the magnetic field vector B (known as the $E \times B$ velocity). The shape of the predominate electron path defines the portion of the target material that will be sputtered.

While planar magnetrons are widely used to sputter non-magnetic target materials, such as aluminum and its alloys, they have not proven particularly useful for sputtering magnetic materials such as, for example, iron, nickel, iron-nickel alloys, and cobalt-chromium alloys. Simply replacing a non-magnetic target in a planar magnetron with a ferromagnetic target of the same general configuration usually causes most, if not all, of the magnetic field to be shunted through the magnetic target. This reduces the intensity of the plasma-confining magnetic tunnel above the target to the point where it can no longer effectively confine the plasma over the surface of the target, thus reducing planar magnetron sputtering to that of ordinary diode sputtering with its attendant relatively slow sputter rate and inefficiency.

One solution to the problem of sputtering magnetic target materials has been to use very thin targets, so that the target does not short out the entire magnetic field. If the target is thin enough (approximately 2-3 mm for a highly ferrous material), sufficient excess magnetic flux will remain over the front surface of the target to produce a plasma-confining magnetic tunnel. Unfortunately, however, such thin targets are rapidly depleted, thus requiring frequent replacement and substantial downtime of the sputtering apparatus.

Another solution to the problem has been to strengthen the magnetic field so that it can saturate thicker targets, yet still produce a plasma-confining magnetic tunnel over the front surface of the target. Usually a field strength in the range of about 80–100 gauss in a direction parallel to the target surface is required to achieve the magnetron effect. While stronger magnets are more expensive, they can, at least theoretically, result in a magnetron suitable for sputtering magnetic targets of sufficient thicknesses to offset the additional cost of the stronger magnets. Unfortunately, however, sputtering magnetrons that magnetically saturate the target suffer from another problem that has proven much more difficult to overcome: Namely, severe magnetic pinching of the plasma.

The magnetic pinching phenomenon is best understood by referring to FIG. 1 which illustrates, in schematic form, the forces acting on electrons in the region of the magnetic tunnel. In a prior art magnetron, a magnet assembly M produces a magnetic field that can be characterized by a plurality of magnetic flux lines F, one of which is shown in FIG. 1. The flux line F shown in FIG. 1 is representative of the field shape immediately adjacent the front surface of the target. Points 1 and 3 are points in the central region of the tunnel, to the left and right of the central axis C respectively. Point 2 is a point on the central axis C of the tunnel, coincident with the flux line F. The target locations within the tunnel fields are such that each of the points 1, 2, and 3 will be coincident with the front surface of the target at some time during the sputtering process. As is well-known, the curvature of the magnetic field F subjects electrons positioned at points 1 and 3 lateral forces $F_1$ that tend to push them toward the central axis C of the tunnel. Since the magnetic field has no vertical component (i.e., a component orthogonal to the plane of the pole piece) at point 2, no lateral forces are exerted on electrons at point 2. The action of the lateral forces $F_1$ on the electrons in the plasma tends to force or pinch them toward the central axis C of the magnetic tunnel. Since the erosion caused by sputtering is related to the density of the electrons in the glow discharge plasma, the effect of the pinching phenomenon increases the erosion rate along the central axis C of the magnetic tunnel.

While this pinching phenomenon occurs in all types of planar magnetrons with arched magnetic tunnels, the problem becomes much worse when sputtering magnetic target materials, as best seen in FIGS. 2(a)-(d). When sputtering a magnetic target T, a large portion of the magnetic flux F (shown qualitatively in FIGS. 2(a)-(d)) produced by the magnet assembly M will be shunted through the magnetic target. However, if the magnetic field is strong enough, sufficient magnetic flux will remain over the front surface of the target to produce an arched, plasma-confining magnetic tunnel. As was explained above, the pinching forces resulting from the arched magnetic tunnel will initially pinch the electrons toward the center of the tunnel, resulting in the greatest erosion rate at that point. However, as the target erodes, its cross-sectional area decreases, thus forcing additional magnetic flux from the target. Since the excess magnetic flux always takes the lowest energy path (i.e., the path of least resistance), it usually exits the target surface in the erosion area and re-enters the target just as soon as the cross-sectional area has increased to the point where the target material can again accommodate the excess flux. The liberated magnetic flux arching over the front surface of the target subjects electrons within the glow discharge plasma to even greater pinching forces, which substantially increases the electron density, thus erosion rate, along the center of the tunnel, as best seen in FIG. 2(c). As the target erodes further, more and more magnetic flux is liberated, resulting in stronger pinching forces, higher electron densities, and greater erosion rates. The result is a deep, spike-like erosion groove in the target, as best seen in FIG. 2(d).

The fraction of the target material that has been sputtered away by the time the bottom of the erosion groove reaches the back surface of the target is referred to as the target utilization, and is extremely low for most magnetic targets, in the range of 5%–15% at best. Since most target materials tend to be relatively expensive, such low target utilization is wasteful and increases the costs associated with the sputtering process. For example, although spent targets may be recycled and reworked into new targets, the time spent changing and reworking targets can be significant and in any event, increases the overall cost of the sputtering operation.

Another solution to the problem has been to place external magnets above and around the target to generate the plasma-confining magnetic tunnel. However, such systems are prone to the pinching effect described above, and also add considerable complexity, thus cost, to the magnetron assembly. Moreover, unless properly shielded, the additional magnets themselves may sputter and contaminate the coating.

Yet another approach has been to reduce the strength of the magnetic field required to saturate the target material. Since a magnetic material heated above its Curie temperature loses its ferromagnetism, magnetron sputtering of a ferromagnetic target can be more easily accomplished by heating the target material above its Curie temperature. A disadvantage of this approach is that it requires a device for monitoring the temperature of the target as well as a system for achieving and maintaining the required Curie temperature. Also, since the Curie temperature of most ferromagnetic materials is quite high, in the range of 400° C. to 1100° C., heating the target material to such temperatures can damage the substrate being coated or other parts of the vacuum system. Another disadvantage is that most high performance permanent magnets loose their magnetic properties at temperatures above about 150° C. to 200° C., so a cooling system must be provided to maintain the permanent magnets below the critical temperature.

While still other modifications have been developed, each is not without its problems. For example, Deppisch et al in U.S. Pat. No. 4,652,358, attempt to solve the target thickness problem by placing the ferromagnetic target on a specially configured floor located between the target and the magnet assembly. While most of the floor is made from a non-magnetic material, it includes special ferromagnetic inserts in the regions of the poles of the magnet system to improve the magnetic coupling efficiency, thereby lowering the magnetic field density required to saturate the target. Unfortunately, the floor is difficult and expensive to manufacture and, in the preferred embodiment, requires that the ferromagnetic plugs be joined to the non-magnetic floor by electron beam welding to minimize mechanical stress and to produce gas-tight and liquid-tight joints. Moreover, Deppisch et al do not address the pinching problem, leaving his device with poor target utilization.

The patent issued to Abe et al., U.S. Pat. No. 4,401,539, discloses a method and apparatus for sputtering magnetic target materials that uses a combination of permanent magnets and electromagnets to saturate the target and generate the strong leakage flux density over the target surface required to create the plasma-confining magnetic tunnel. Abe et al attempt to minimize the pinching problem by using the electromagnets to vary the strength and configuration of the magnetic field during the sputtering process. Unfortunately, however, the computer controlled electromagnet assembly is complex and expensive to fabricate.

Boys et al. in U.S. Pat. No. 4,500,409, disclose a planar magnetron for sputtering highly ferromagnetic targets that uses only electromagnets to saturate the target and produce the plasma-confining magnetic field over the target surface. Boys et al. also address the pinching problem by varying the strength of the magnetic field produced by the electromagnets. However, like the magnetron disclosed in the Abe patent, the magnetron disclosed by Boys et al. is relatively complex and expensive to manufacture. Moreover, the design constraints associated with most magnetron cathode assemblies tends to limit the size of the electromagnets and the resulting magnetic field, thus requiring the use of relatively thin targets.

The patents issued to Morrison, U.S. Pat. Nos. 4,391,697 and 4,431,505, disclose yet another type of magnetron sputtering apparatus for sputtering ferromagnetic targets. Morrison's device utilizes a two piece target with a gap between the pieces. According to Morrison, while most of the applied magnetic field concentrates in the gap between the target pieces, there remains sufficient excess flux to form a weak plasma trapping field over the surface of the target. The gap serves as a plasma source, which plasma then migrates to the trapping field to sputter the target. Disadvantageously, the two piece target required by the Morrison device is relatively complex. Also, Morrison recognizes that the gap floor can sputter, thus possibly contaminating the coating or, worse yet, erode through to the magnet assembly. However, Morrison seems to accept those disadvantages as the price to be paid for sputtering ferromagnetic materials.

Finally, Aichert et al. in U.S. Pat. No. 4,572,776, attempt to achieve magnetron sputtering of a magnetic target by using a ferromagnetic pole shoe assembly to assist in producing a plasma-confining tunnel over the surface of the target. Unfortunately, portions of the ferromagnetic pole shoe assembly do sputter, thus requiring that it be made of the same material as the target, or else risk contaminating the coating. However, if the pole shoe is made of the same material as the target, then any cost advantages are lost, and Aichert's device simply becomes another magnetron having a two-piece target. Also, the pole shoe and target assemblies must be positioned with respect to each other at certain specifically defined spacings and tolerances that may be difficult to maintain during the sputtering operation.

In sum, while the foregoing devices represent some improvements, they have usually come at the expense of decreased power efficiency, decreased target replacement intervals, or have required two-piece target configurations or the addition of separate or additional electromagnetic coils, along with apparatus to control the electromagnets. Besides increasing the overall cost of the sputtering device, the addition of large numbers of components into the sputtering chamber may poison the sputtered film with unwanted impurities if suitable precautions are not taken to insure that the additional components themselves do not sputter. Also, few of the prior art references provide an effective solution to the magnetic pinching problem.

Therefore, there remains a need for a planar magnetron that can sputter ferromagnetic targets without the severe disadvantages that result from the magnetic pinching problem. Such a magnetron should also be capable of achieving high target utilization rates, but without the need to resort to complex target configurations, electromagnet assemblies or, worse yet, magnet assemblies containing both electromagnets and permanent magnets. Such a permanent magnet magnetron should also be capable of sputtering a relatively thick ferromagnetic target without having to heat it to its Curie temperature.

SUMMARY OF THE INVENTION

Accordingly, it is a general object of the invention to provide a magnetron sputter coating source for sputtering magnetic targets.

It is another object of this invention to provide a magnetron sputter coating source having increased target utilization.

A further object is to sputter magnetic target materials at temperatures below the Curie temperatures of the materials.

It is yet another object of this invention to reduce magnetic pinching of the glow discharge associated with magnetically saturated targets.

It is yet a further object to provide a magnetron sputtering source that does not require electromagnets to reduce magnetic pinching of the glow discharge plasma.

Still another object of this invention is to provide a magnetron sputter coating source for sputtering a single piece planar magnetic target.

Additional objects, advantages, and novel features of this invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purposes of the present invention, as embodied and broadly described herein, the sputtering magnet assembly according to this invention may comprise a magnet assembly positioned adjacent the back surface a target for generating a magnetic field having sufficient strength to magnetically saturate the target and to produce a plasma-confining magnetic tunnel over the front surface of the target. A magnetic shunt positioned a spaced distance from the back surface of the target provides an alternate path for most of the excess magnetic flux liberated by the erosion of the target. The alternate path is characterized by a lower magnetic resistance than paths which exit the front surface of the target, pass into the sputtering region, and re-enter the front surface of the target.

The method of sputtering magnetic target materials according to the present includes the steps of establishing a low pressure sputtering atmosphere in a sputtering chamber; creating a glow discharge over a sputtering region on a magnetic target located within the sputtering chamber; generating a magnetic field with sufficient strength to saturate the target and to produce a plasma-confining magnetic tunnel over the front surface of the target; and shunting excess magnetic flux liberated by the erosion of the target through an alternate path that is characterized by a lower magnetic resistance than paths that exit the front surface of the target, pass into the sputtering region, and re-enter the front surface of the target.

BRIEF DESCRIPTION OF THE DRAWINGS

The accompanying drawings, which are incorporated herein and form a part of the specification illustrate the preferred embodiments of the present invention, and together with the description, serve to explain the principles of the invention. In the drawings:

FIG. 3 is a plan view of a first embodiment of the sputtering magnet assembly according to the present invention for sputtering a rectangular target with a portion of the target broken away to show the positions and orientations of the magnets and the magnetic shunt;

FIG. 11 is a cross section view in elevation of a circular magnet and target assembly of the types shown in FIGS. 9 and 10 showing a computer generated plot of the magnetic field;

FIG. 12 is a cross section view in elevation of the magnet assembly shown in FIG. 11, but with the addition of a magnetic shunt;

FIG. 13 is a cross section view in elevation of the magnet assembly shown in FIG. 12, but with the width and position of the shunt slightly changed to optimize the configuration of the magnetic field; and FIG. 14 is a cross section view in elevation of a third embodiment of the sputtering magnet assembly for sputtering wide rectangular targets or large diameter circular targets.

DETAILED DESCRIPTION OF THE PREFERRED EMBODIMENT

Figure 1:
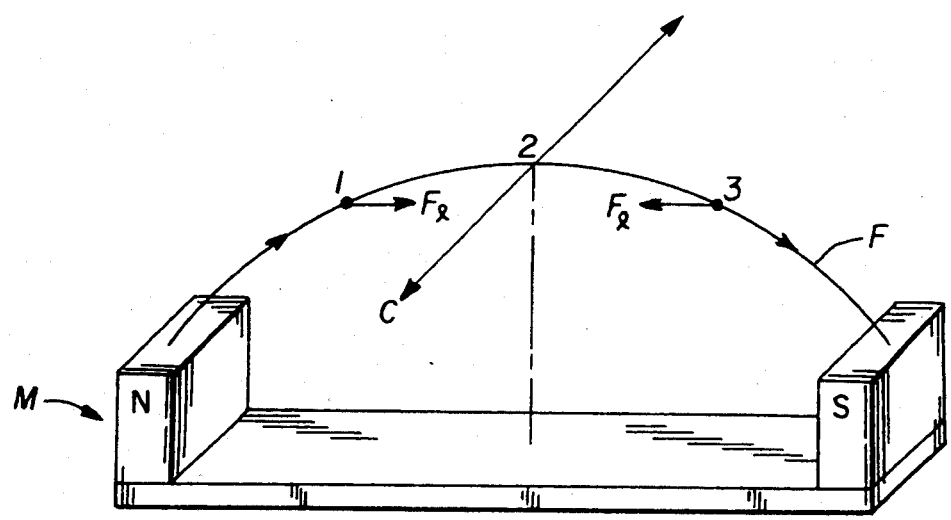
FIG. 1 is a schematic perspective view of a prior art sputtering magnetron qualitatively showing an arched magnetic flux line of the magnetic tunnel and the forces acting on electrons at various points.
Figure 2A:
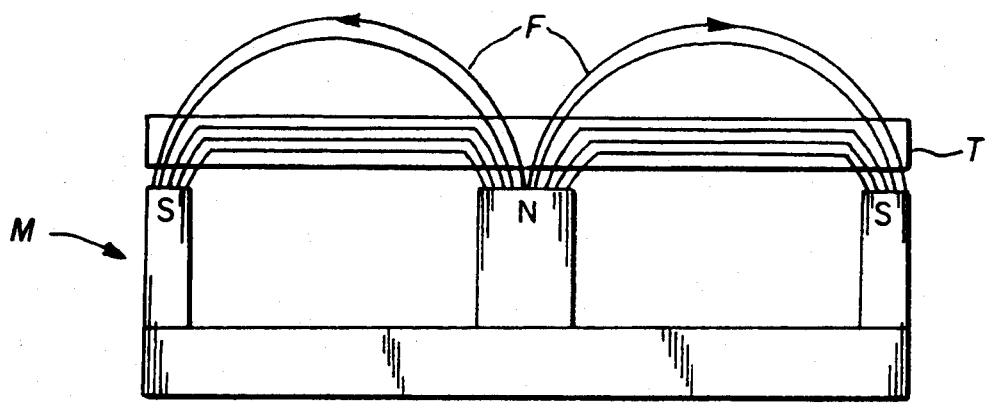
FIGS. 2(a)-(d) are schematic cross section views in elevation of a prior art sputtering magnetron for sputtering a magnetic target qualitatively showing the configuration of the magnetic tunnel and the erosion pattern resulting from the magnetic pinch phenomenon.
Figure 2B:
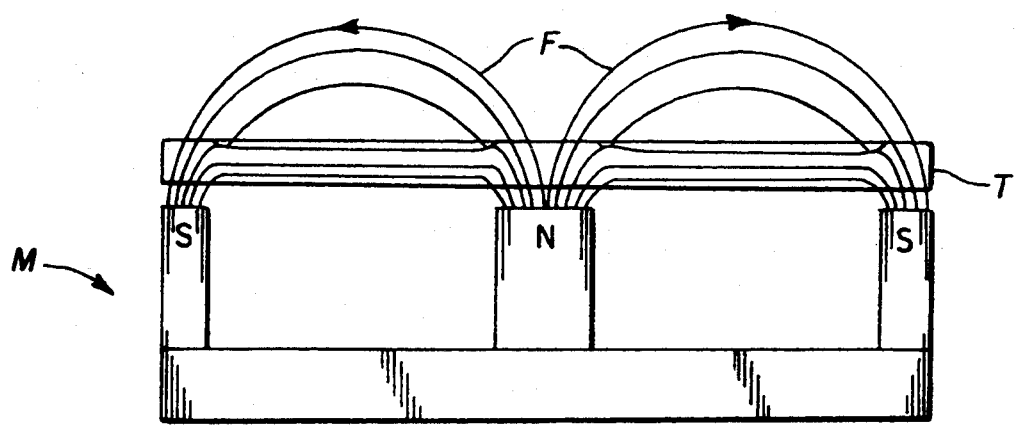
Figure 2C:
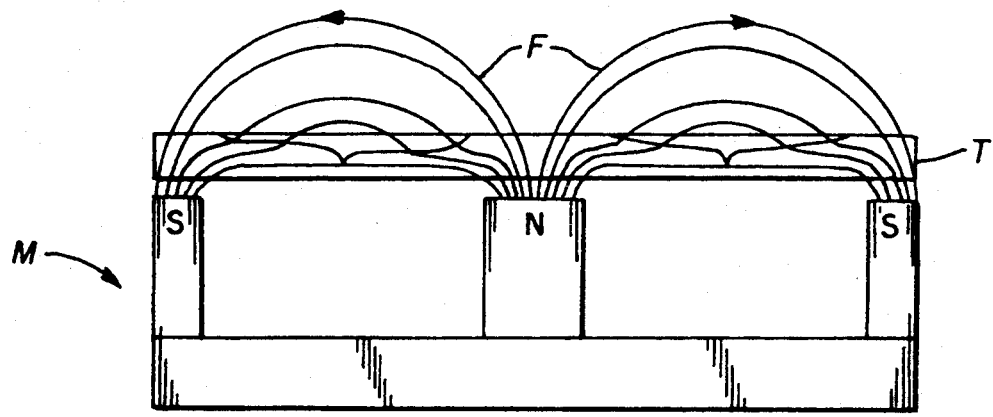
Figure 2D:
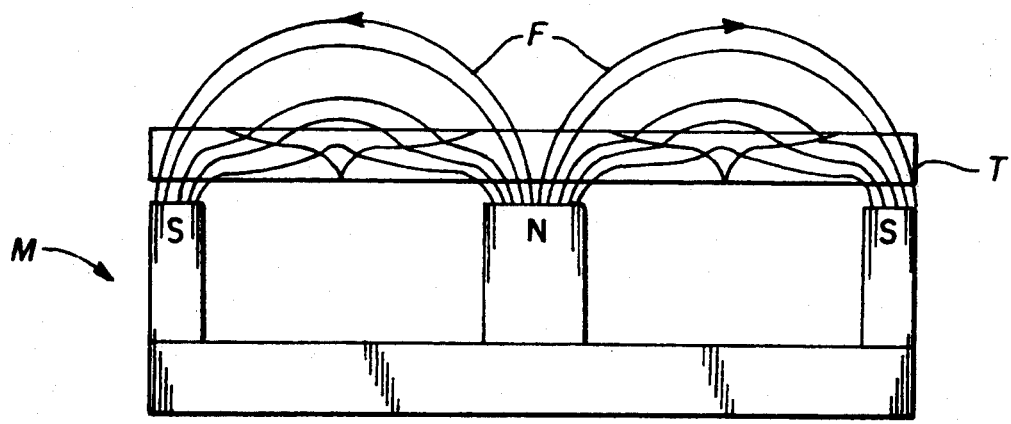
Figure 4:
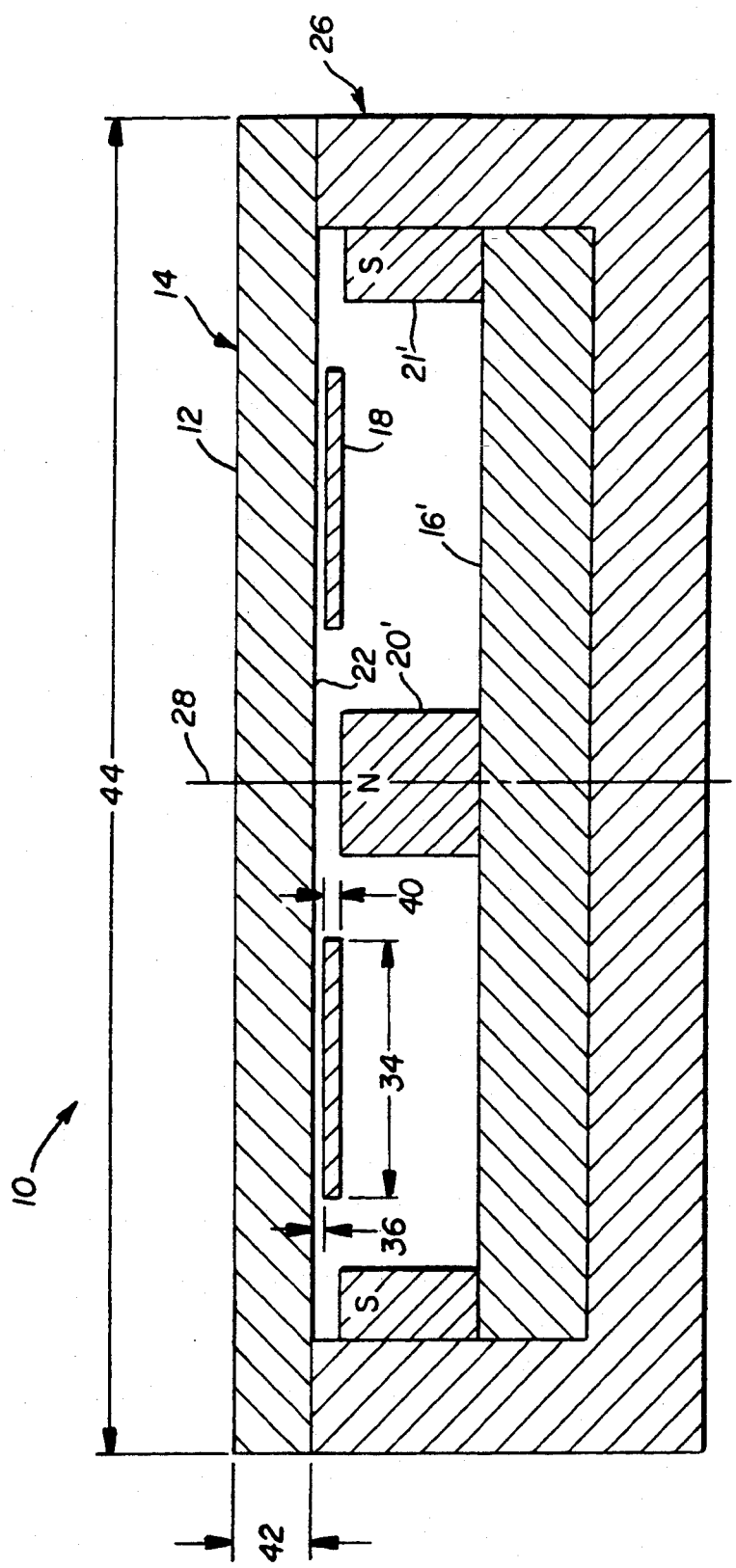
FIG. 4 is a schematic cross section view in elevation of the sputtering magnet assembly according to the present invention taken along the lines 4—4 of FIG. 3 and showing the position of the target with respect to the magnet assembly and the magnetic shunt.
Figure 5:
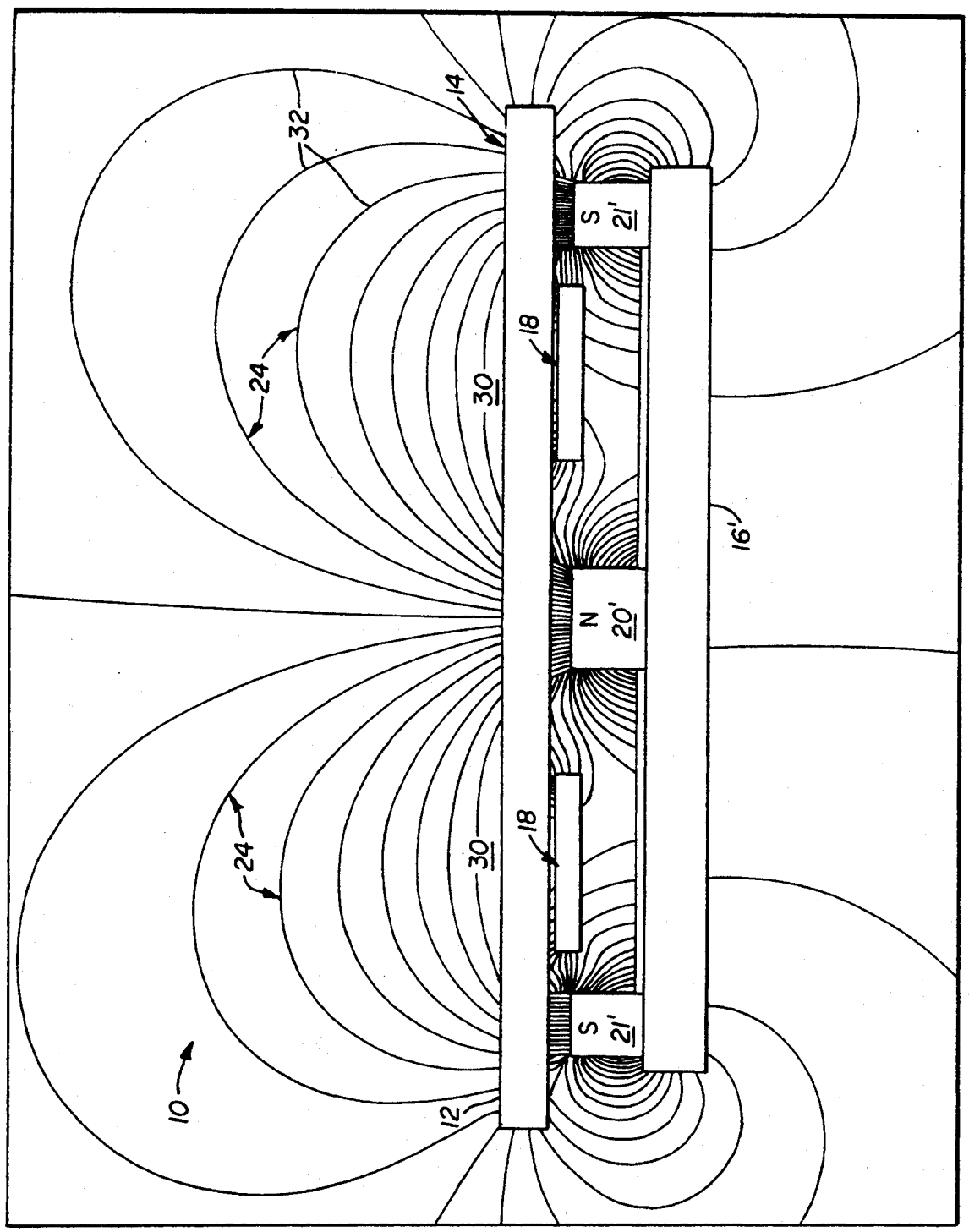
FIG. 5 is a cross section view in elevation of the first embodiment of the sputtering magnet assembly shown in FIGS. 3 and 4, including a computer generated plot of the magnetic field.

The sputtering magnet assembly 10 according to the present invention is best seen in FIGS. 3, 4, and 5 as it is configured to generate a closed loop magnetic tunnel 24 over the front surface 12 of a flat rectangular ferromagnetic target 14. The magnetic tunnel 24 includes two linear sections in parallel-spaced-apart relation extending along most of the length of the rectangular target 14 that are joined at each end by a semi-circular end section, thus forming a continuous magnetic tunnel in the shape of a flattened oval or racetrack. The magnet assembly 10 is similarly shaped and comprises a flattened oval shaped base pole piece 16 mounted within a cathode assembly 26. Each semi-circular end section 17 of the base pole piece 16 includes a central magnet 20 positioned at the radius center or axis of symmetry 28 of the semi-circular end section 17 and is oriented so that its north pole N is adjacent the back surface 22 of target 14. A plurality of outer magnets 21 surround the central magnet 20 and have opposite magnetic orientations, i.e., their south poles S are adjacent the back surface 22 of target 14. The configuration of the elongated rectangular center section 16' of base pole piece 16 is similar to the configuration of each semi-circular end section, with the only difference being that the magnets are arranged in a linear configuration, as opposed to a circular configuration. Specifically, the center section 16' includes an elongated central magnet 20' that extends between each cylindrical central magnet 20. Likewise, a pair of elongated outer magnets 21' extend between the outer magnets 21 in each semi-circular end section, as best seen in FIG. 3. A magnetic shunt 18 in the shape of a flattened oval is positioned between the central magnets 20 and 20' and the outer magnets 21 and 21' and is close to the back surface 22 of ferromagnetic target 14.

The combination of central magnets 20 and 20', outer magnets 21 and 21', base pole piece 16, and shunt 18, all of which form the magnet assembly 10, produce a racetrack shaped magnetic field that can be represented by a plurality of magnetic flux lines 32, shown in FIG. 5, which is drawn to scale. Actually, FIGS. 5–8 and 11–13 herein are all drawn to scale and the magnetic flux lines shown therein were generated by a finite element computer modeling program of the kind that are readily commercially available and well-known to persons having ordinary skill in the art. In those drawings, the spacing between the flux lines is proportional to the magnetic flux density, i.e., field strength. The closer the line spacing, the stronger the magnetic field. In the interest of clarity, the flux lines inside the magnets and the pole piece are not shown.

While most of the magnetic flux is shunted through the target 14, sufficient magnetic flux remains over the front surface 12 of target 14 to produce a plasma-confining magnetic tunnel 24, as best seen in FIG. 5. The plasma-confining magnetic tunnel 24 defines a sputtering region 30 that is adjacent the front surface 12 of target 14. A portion of the magnetic flux also passes through the shunt 18, but does not magnetically saturate shunt 18.

When sputtering a new target 14, the plasma-confining magnetic tunnel 24 confines the glow discharge (not shown) substantially to the area of the sputtering region 30, thus achieving the magnetron effect and maximizing sputtering efficiency. As the front surface 12 of the ferromagnetic target 14 erodes, its cross-sectional area is gradually reduced, thus forcing some of the magnetic flux that had been shunted through the target to find an alternate path. In the prior art apparatus, that excess flux tended to emerge from the front surface of the target, loop into the sputtering region, and re-enter the target plate when the cross-sectional area again became great enough to accommodate the excess flux. As was described above, the escape of the excess magnetic flux into the sputtering region resulted in severe magnetic pinching forces that ultimately produced a very narrow, spike-like erosion groove that would quickly reach the back surface of the target before barely 10% of the target material had been sputtered.

In contrast to the prior art, the magnetic shunt 18 of the present invention provides a lower energy pathway for most of the excess magnetic flux liberated by target erosion. In the present invention, then, the excess magnetic flux liberated from the gradually eroding target emerges from the back surface of the target, passes through the shunt, and re-enters the target material when the cross-sectional area of the target is again sufficient to accommodate the excess flux. By preventing the excess magnetic flux from emerging into the sputtering region, the present invention substantially reduces the magnetic pinching forces in the sputtering region, thus significantly increasing target utilization.

Another significant advantage of the magnet assembly 10 according to the present invention is that it can be used to sputter relatively thick targets without the need to raise the temperature of the target material above its Curie temperature. The ability to sputter thicker targets increases the production run for a given target and reduces the downtime associated with target recycling and target replacement. Furthermore, since the present invention uses simple static magnetic fields to produce the increased target utilization, it does not require complex mechanical or electromagnetic apparatus to move the magnetic field with respect to the target, with all their associated disadvantages. Consequently, the entire sputtering magnet assembly according to the present invention may be coated with an inert insulating material to prevent the magnet assembly from corroding if it is immersed in water or some other coolant.

While magnetic shunts have been used in some types of planar magnetrons to sputter non-magnetic targets, they have never been successfully used with magnetic target materials, doubtless because the teachings associated with those devices are not applicable to the special problems associated with sputtering magnetic target materials.

For example, Welty, in U.S. Pat. No. 4,892,633, teaches the use of a magnetic shunt positioned adjacent the back surface of the target to reduce the effect of magnetic pinching on non-magnetic target materials. Welty uses his shunt to produce an inflection point or "dip" in the magnetic field near the center of the plasma-confining tunnel. The purpose of the dip is to force electrons in the plasma away from the tunnel center, thus increasing the uniformity of the electron density within the plasma, and producing a more uniform erosion rate. However, if Welty's field is used in conjunction with a magnetic target, it achieves the opposite result. That is, Welty's dipped magnetic field will result in two deep, spike-like erosion grooves on either side of the dip, with little or no sputtering occurring elsewhere. Welty's device does not work with magnetic target materials because the excess magnetic flux liberated by the erosion of a magnetic target tends to concentrate in the convex field regions adjacent either side of the dip, which of course, magnifies the pinching forces, as described earlier. However, since no excess magnetic flux is liberated by the erosion of a non-magnetic target, there was no need for Welty to consider the effect of the liberated magnetic flux on the performance of his invention.

Before proceeding with a detailed description of the sputtering magnet assembly 10 according to the present invention, it should be noted that the magnet assembly may take on different configurations depending on the particular target shape and the desired erosion pattern. For example, the embodiment shown in FIGS. 3–8 is specifically configured to sputter rectangular targets, so the magnet assembly 10 is configured to produce a plasma-confining tunnel having two linear sections in parallel, spaced-apart relation that extend along most of the length of the rectangular target. The two linear sections are joined at each end by a semi-circular section, thus forming a continuous tunnel in the shape of a flattened oval or racetrack. On the other hand, if the magnetron is to be used to sputter circular targets, such as the embodiment shown in FIGS. 9–13, then the magnet assembly 110 is configured to produce a plasma-confining magnetic tunnel in the shape of a circular ring. Finally, since the details of the other components required to construct and operate a planar magnetron sputtering apparatus, such as the vacuum chamber, apparatus for mounting and cooling the cathode/target, and apparatus for electrically connecting the cathode/target to the voltage source, etc., are well known to persons having ordinary skill in the art, such other components are not shown and described herein. Persons skilled in the art would also recognize the need to surround the magnet assembly with a suitable ground shield to prevent unwanted sputtering of the magnet assembly and to prevent arcing.

Referring back again to FIGS. 3–5, the sputtering magnet assembly 10 is specifically configured to generate a racetrack-shaped magnetic tunnel 24 for sputtering a plate-like rectangular target of cobalt alloy having a mean width 44 of about 12.7 cm (5 inches) and a mean thickness 42 of about 0.80 cm (0.31 inches). The length of the rectangular target has little, if any, effect in achieving the objects of the present invention, and the length of the rectangular target can be selected depending on the particular requirements of the application. Since the magnet assembly 10 is specifically configured to sputter a rectangular target, base pole piece 16 is in the shape of a flattened oval and is constructed from a magnetically permeable material, such as Permalloy, iron, or nickel, to minimize magnetic losses. The individual magnets 20, 20', 21, and 21' are likewise arranged in the shape of a flattened oval directly on the base pole piece 16, as best seen in FIG. 3. Specifically, each cylindrical central magnet 20 is mounted to base pole piece 16, concentric with the radius center or axis of symmetry 28 of each semi-circular end section 17. Each cylindrical central magnet 20 is oriented so that its north pole N is immediately adjacent the back surface 22 of target 14. The elongated central magnet 20' extends between each cylindrical central magnet 20 and is aligned with a longitudinal axis 28' connecting each axis of symmetry 28. A plurality of outer magnets 21 and 21' are mounted to the outer periphery of base pole piece 16 and have magnetic orientations opposite the central magnets 20 and 20', i.e., the south poles S of the outer magnets 21 and 21' are immediately adjacent the back surface 22 of target 14, as best seen in FIGS. 3 and 4. In the preferred embodiment, each cylindrical central magnet 20 is 9.5 mm high and has a diameter of 25 mm, while the elongated central magnet 20 is 9.5 mm high, 13 mm wide, and sufficiently long to extend between the two cylindrical magnets 20. The outer magnets 21 are each 9.5 mm high and 8 mm wide, while the two elongated outer magnets 21' are each 9.5 mm high, 8 mm wide, and sufficiently long to extend between the outer magnets 21 at each semi-circular end section 17. Alternatively, and as would be obvious to persons having ordinary skill in the art, a plurality of smaller magnets, arranged end-to-end, could be substituted for the single elongated central magnet 20' or for each of the single elongated outer magnets 21'. All magnets are rare earth Neodymium Iron Boron (NdFeB) and have magnetic field energy products of at least 35 megagauss-oersted (MGOe). However, other types of rare earth magnets, such as Samarium Cobalt (SmCo) magnets, may be substituted with equal effectiveness. Also, the relative magnetic orientation of the magnets are arbitrary, and persons having ordinary skill in the art would recognize that the invention would work equally as well if the respective magnetic orientations of the magnets were reversed.

A magnetic shunt 18 in the form of a flattened oval or racetrack has a width 34 and a thickness 40 and is disposed between the central magnets 20 and 20' and the outer magnets 21 and 21', as best seen in FIGS. 3 and 4. Shunt 18 is positioned adjacent the back surface 22 of target 14 so that a gap 36 exists between the shunt 18 and the back surface 22 of target 14. Since the purpose of the magnetic shunt 18 is to provide a lower energy pathway for excess magnetic flux, thus preventing the flux from emerging into the sputtering region, the dimensions of the gap 36 as well as the width 34 and thickness 40 of the shunt are critical parameters in achieving the objects of the invention. The following discussion is directed to a method of determining those critical parameters.

In the preferred embodiment, magnetic coupling of the magnetic flux produced by the magnets 20, 20', 21, and 21' is achieved by placing the magnets directly on the base pole piece 16. The magnetic flux is carried in closed magnetic circuits which consist of the magnets 20, 20', 21, and 21' the base pole piece 16, the target 14, and the shunt 18. As is well-known in the art, the following condition must be satisfied to magnetically saturate the target and produce the plasma-confining magnetic tunnel 24 over the front surface 12 of target 14:

$$\Phi_L > M_S t \quad (1)$$

Where:

$\Phi_L$ = magnetic flux per unit length produced by the magnet assembly;

$M_S$ = saturation magnetization of the target material; and t = target thickness.

Thus, for a given magnetic field strength and a given target material, the thickness 42 of target 14 is the critical parameter to ensure that the target material is magnetically saturated. In order to sputter the thickest target possible, the magnetic circuit should be arranged to minimize losses and coupling inefficiencies. For example, magnetic losses can be minimized by using highly permeable materials for the base pole piece 16 such as, for example, Permalloy, soft iron, or nickel, and by providing the base pole piece 16 with adequate cross-sectional area. If at the same time Equation 1 is satisfied, the excess magnetic flux in front of the target will form a plasma-confining magnetic tunnel of sufficient strength to achieve the magnetron effect. Generally speaking, a field strength in the range of about 80–100 gauss in a direction parallel to the target surface is the minimum required to achieve the magnetron effect. Finally, it should be noted that, while Equation 1 accurately describes the condition required to magnetically saturate the target 14 if the magnetic shunt 18 does not absorb any flux, it may be necessary to increase the overall magnetic flux $\Phi_L$ somewhat to compensate for the flux diverted through shunt 18.

To minimize the pinching effect, the magnetic shunt 18 should be magnetically unsaturated during the entire sputtering operation. That is, the shunt 18 must be capable of absorbing all, or nearly all, of the excess magnetic flux expected to be liberated from the target. Since it is usually desirable to erode nearly the entire thickness of the target 14, the magnetic shunt 18 should be capable of absorbing all of the magnetic flux that is carried by the magnetically saturated target 14. That is:

$$M_{Starget} t_{target} \approx M_{Sshunt} t_{shunt} \quad (2)$$

To minimize the thickness 40 of the shunt 18, it is usually desirable to fabricate the shunt from a material having a high magnetic saturation, such as soft iron. In that case, the saturation magnetization of the shunt is known, and the thickness 40 of the shunt 18 is then given approximately by the following equation:

$$t_{shunt} \approx \frac{M_{Starget} t_{target}}{M_{Sshunt}} \quad (3)$$

As was briefly described above, the shunt 18 must be placed relatively close to the back surface 22 of target 14, but not in contact with the back surface. In the preferred embodiment, it has been found that the gap 36 should be between about 0.025 cm and 0.100 cm (0.010–0.040 inches), with the preferred gap width 36 being about 0.050 cm (0.020 inches).

The ratio of shunt width to gap width is also important in achieving the objects of the invention. Good results can be obtained when the width 34 of shunt 18 is between about 10 to 90 times the width of gap 36, with the best results being obtained when the shunt width is about 30 to 40 times the gap width.

Figure 6:
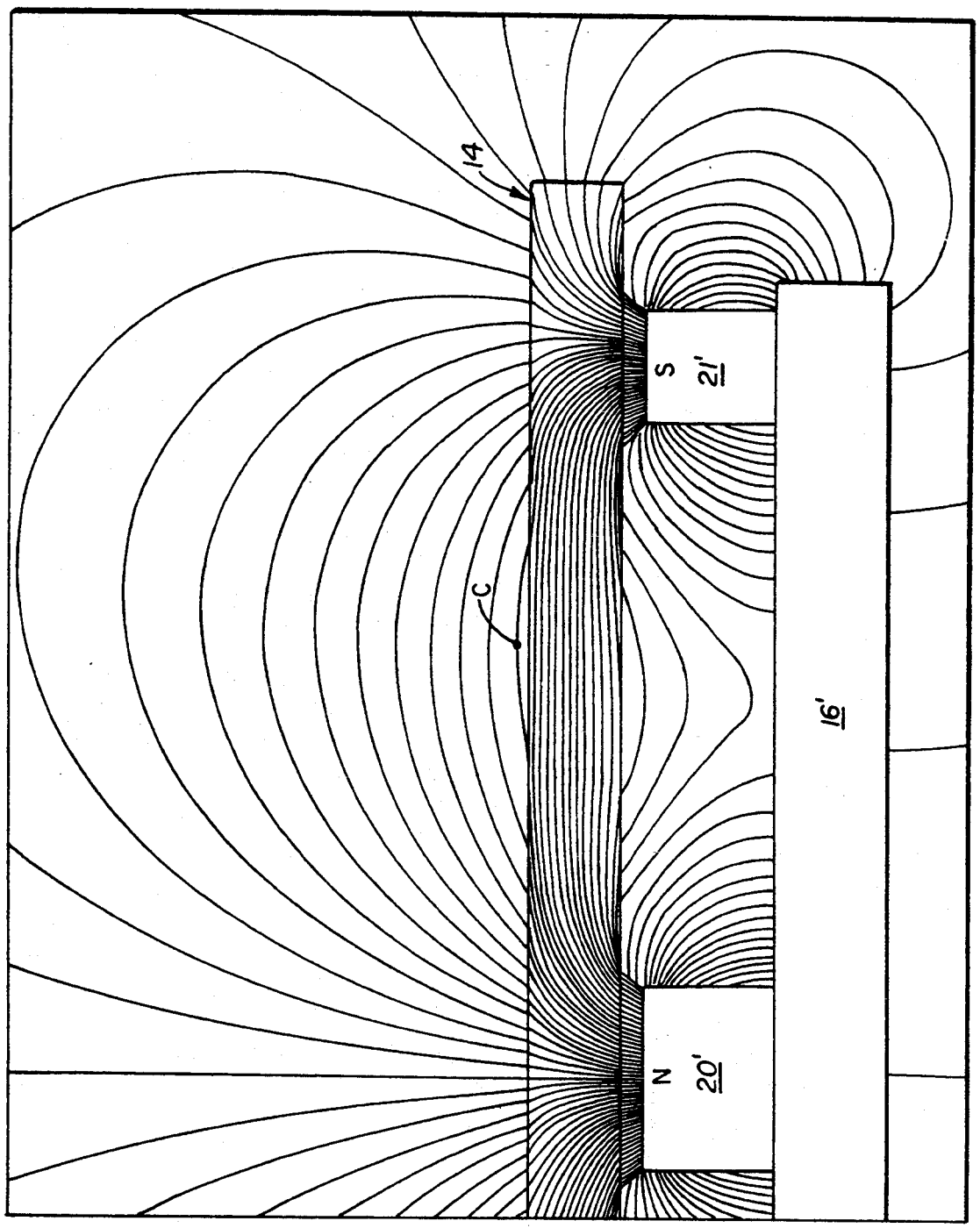
FIG. 6 is a cross section view in elevation of a magnet and target assembly, including a computer generated plot of the magnetic field.
Figure 7:
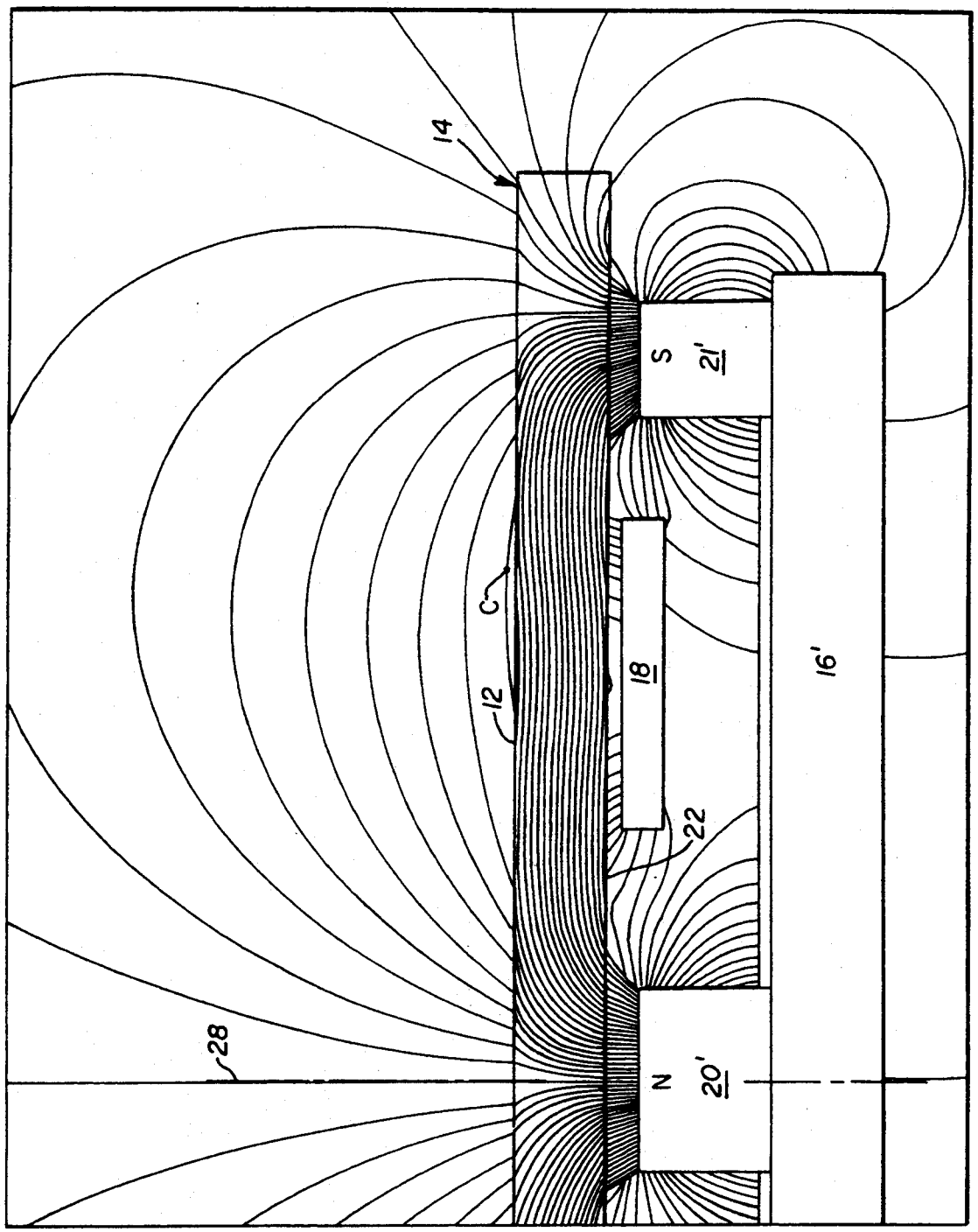
FIG. 7 is a cross section view in elevation of the magnet and target assembly shown in FIG. 6, but with the addition of a magnetic shunt.

While the objects of the invention can be achieved by providing a magnet structure and shunt substantially as shown and described above, the magnetron assembly can often be optimized by using one of the many commercially available computer modeling programs to refine the proposed configuration. The first step in optimizing the design is to select a magnet assembly and target material to be sputtered. The computer program can then be used to plot the resulting magnetic field. See FIG. 6. For best results, the magnetic field should be "balanced," i.e., the central axis C of the magnetic tunnel should be located about midway between the respective central magnets 20 and 20' and the outer magnets 21 and 21'. The field should also be reasonably symmetrical on either side of the central axis C, as best seen in FIG. 6. If the magnet and target assembly do not initially produce such a magnetic field configuration, then the relative positions of the magnets should be changed and the new configuration remodeled, until a field configuration substantially as shown in FIG. 6 is produced.

Figure 8:
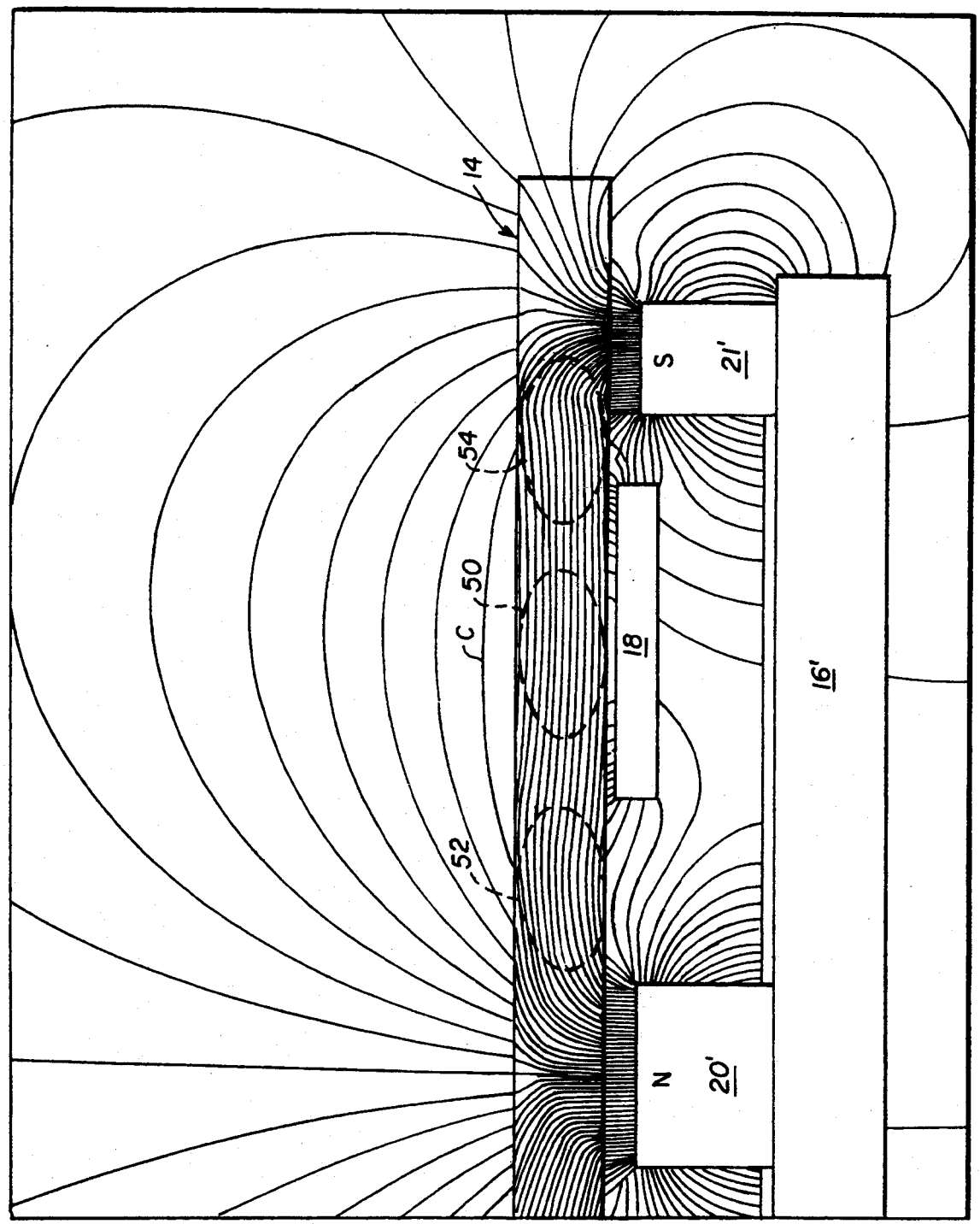
FIG. 8 is a cross section view in elevation of the magnetron assembly shown in FIG. 7, but with the shunt slightly relocated to optimize the configuration of the magnetic field.

After the magnet and target assembly is balanced, a magnetic shunt having the desired thickness 40 and width 34 (FIG. 4) is then added to the model and the field shape re-computed. See FIG. 7. For best results, the region defined by the magnetic flux lines that are substantially parallel to the front surface 12 of target 14 must be made as large as possible. Normally, it will be possible to position the shunt 18 so that the magnetic flux lines are substantially parallel to the front surface of the target over a range of about 30%–50% of the usable target surface, i.e., that portion of the target that extends from the axis of symmetry 28' to the outer magnets 21'. In the preferred embodiment, it was necessary to move the shunt 18 approximately 2 mm to the right and about 0.5 mm closer to the back surface 22 of target 14 to maximize the region within which the magnetic flux lines were substantially parallel to the front surface of the target. The resulting configuration is shown in FIG. 8.

As described above, any inflection points or dips in the magnetic field, such as taught by Welty, must be avoided. The magnetic flux lines must be flat and nearly parallel to the front surface of the target. Dips or curves in the magnetic field will result in a deep, spike-like erosion grooves with little or no sputtering occurring elsewhere.

It should be noted that the shunt 18 also has the effect of reducing the strength of the magnetic field within the target body in the region 50 next to the shunt, which reduction is also important in achieving the objects of the invention. In the embodiment shown in FIG. 8, the strength of the magnetic field in region 50 is only about 40% to 60% of the strength of the field in regions 52 and 54.

By way of example, the methods and equations described above were used to come up with the following dimensional parameters for the target 14 and magnetic shunt 18:

| | |
|---|---|
| Target Material: | Cobalt Alloy |
| Saturation Magnetization of Target Material: | ~6,000 gauss/cm$^2$ |
| Target Width: | 12.7 cm |
| Target Thickness: | 0.80 cm |
| Shunt Material: | soft iron |
| Saturation Magnetization of Shunt Material: | ~21,000 gauss/cm$^2$ |
| Shunt Width: | 2.0 cm |
| Shunt Thickness: | 0.318 cm |
| Gap Between Shunt and Target: | 0.050 cm |

Figure 9:
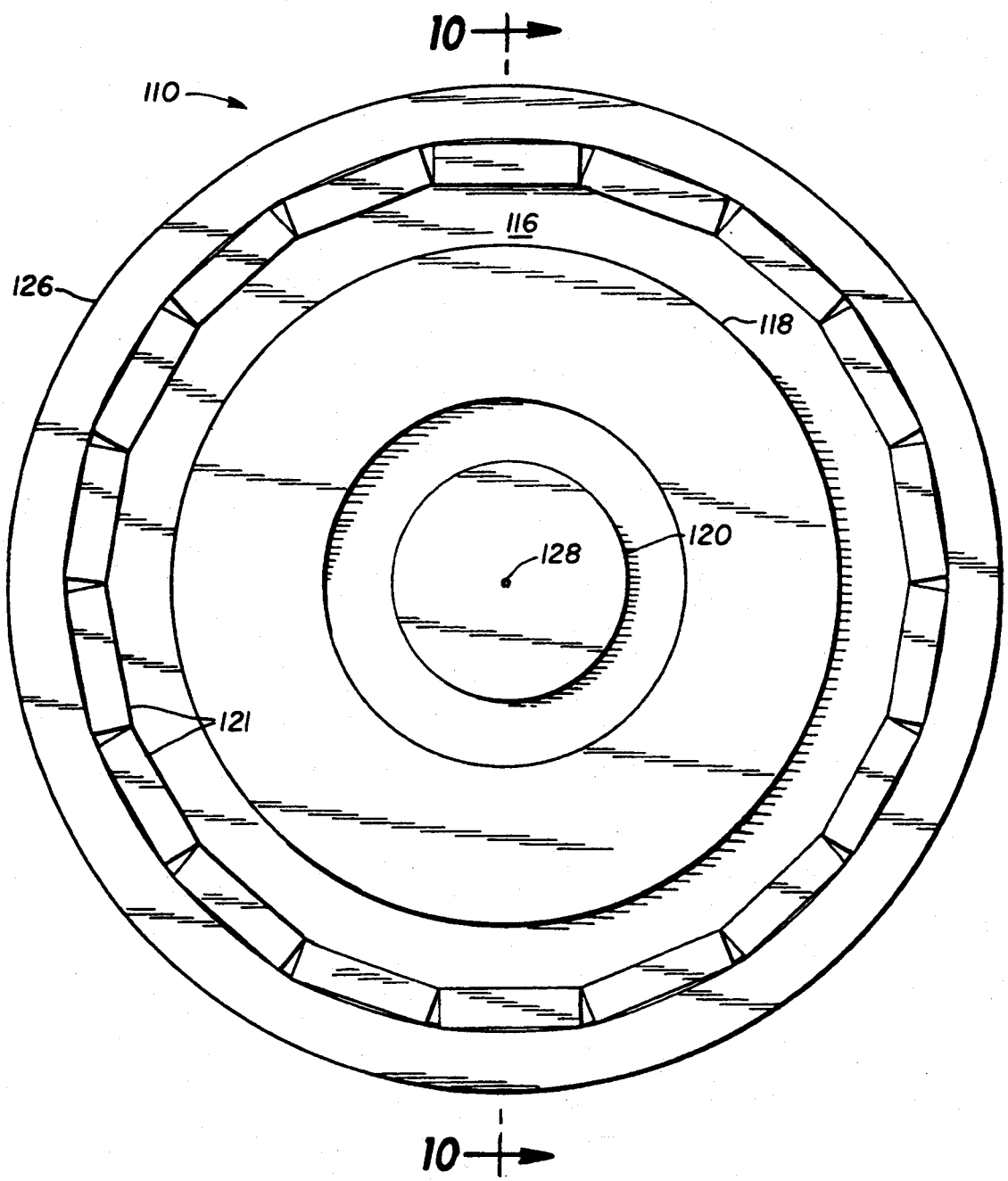
FIG. 9 is a plan view of a second embodiment of the sputtering magnet assembly for sputtering a circular target, but with the target removed to show the positions and orientations of the magnets and magnetic shunt.
Figure 10:
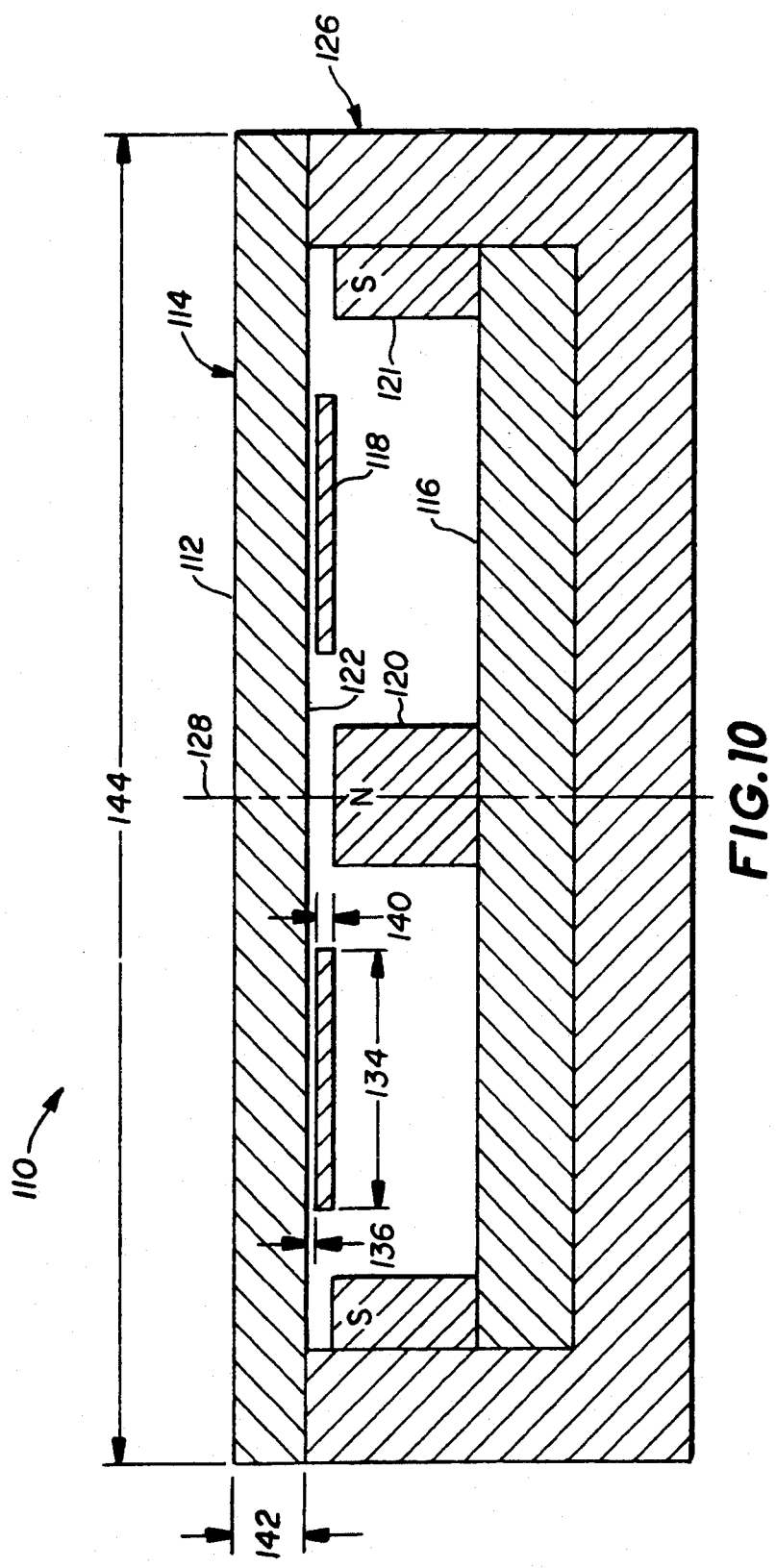
FIG. 10 is a schematic cross section view in elevation of the sputtering magnet assembly taken along the lines 10—10 of FIG. 9 showing the position of the target with respect to the magnet assembly and magnetic shunt.

The sputtering magnet assembly according to this invention can also be configured for use with circular, as opposed to rectangular, targets. Referring now to FIGS. 9 and 10, the sputtering magnet assembly 110 is specifically configured to generate a ring-shaped magnetic tunnel for sputtering a plate-like circular target of cobalt alloy having a mean diameter 144 of about 12.7 cm (5 inches) and a mean thickness 142 of about 0.80 cm (0.31 inches). Since the magnet assembly 110 is specifically configured to sputter a circular target, base pole piece 116 is also circular and is constructed from a magnetically permeable material, such as Permalloy, iron, or nickel, to minimize magnetic losses. The individual magnets 120 and 121 are likewise arranged in a circular manner directly on the base pole piece 116, as best seen in FIG. 9. As was the case for the semi-circular end sections 17 of the first embodiment 10, the cylindrical central magnet 120 is mounted to the center of base pole piece 116, concentric with axis of symmetry 128 of target 114, and is oriented so that its north pole N is immediately adjacent the back surface 122 of target 114. A plurality of outer magnets 121 are mounted to the outer periphery of base pole piece 116 and have magnetic orientations opposite the central magnet 20, i.e., the south poles S of the outer magnets 121 are immediately adjacent the back surface 122 of target 114. In the embodiment shown in FIGS. 9–13, the central magnet 120 is 9.5 mm high and has a diameter of 25 mm, while the outer magnets 121 are each 9.5 mm high and 8 mm wide.

A magnetic shunt 118 in the form of a flat ring has a width 134 and a thickness 140 and is positioned between the central magnet 120 and the outer magnets 121, as best seen in FIGS. 9 and 10. Shunt 118 is positioned adjacent the back surface 122 of target 114, so that a gap 136 exists between the shunt 118 and the back surface 122 of target 114. As was the case for the first embodiment 10 for sputtering rectangular targets, the second embodiment 110 for sputtering circular targets can be optimized by using a computer modeling program to refine the proposed configuration.

As shown in FIG. 11, the proposed configuration was first modeled without the presence of a magnetic shunt 118 to balance the magnetic field. In the first embodiment, the central axis C of the magnetic tunnel was located approximately midway between the central magnet and the outer magnets. While that configuration will produce satisfactory results for a circular target, it has been found that somewhat better results can be obtained for circular targets if the central axis C is located slightly closer the cylindrical central magnet 120, as shown in FIG. 11.

A magnetic shunt 118 22 mm wide and 3.2 mm thick was then centered approximately below central axis C and positioned 2 mm from the back surface 122 of target 114. The field shape was then re-computed, as shown in FIG. 12. While the field lines shown in FIG. 12 are relatively flat over a large portion of the useable target surface, it is also important that the strength of the field in the region 150 next to the shunt be lower than the strength of the field in regions 152 and 154. In the configuration shown in FIG. 12, that reduction is not great enough to produce the best results. Consequently, the configuration and positioning of the shunt 118 was changed slightly to produce a greater reduction in the strength of the magnetic field in region 150. The final configuration is shown in FIG. 13, wherein the gap width was reduced to 1 mm and the width of the shunt reduced to 20 mm.

The optimized magnetron assembly shown in FIG. 13 has the following dimensional parameters:

| | |
|---|---|
| Target Material: | Cobalt Alloy |
| Saturation Magnetization of Target Material: | ~6,000 gauss/cm$^2$ |
| Target Diameter: | 12.7 cm |
| Target Thickness: | 0.90 cm |
| Shunt Material: | soft iron |
| Saturation Magnetization of Shunt Material: | ~21,000 gauss/cm$^2$ |
| Shunt Width: | 2.0 cm |
| Shunt Thickness: | 0.32 cm |
| Gap Between Shunt and Target: | 0.1 cm |

A third embodiment 210 of the sputtering magnet assembly according to the present invention is shown in FIG. 14. The third embodiment is preferred when sputtering rectangular targets wider than about 12.7 cm (5 inches) or circular targets having diameters greater than about 12.7 cm (5 inches). Essentially the third embodiment 210 is identical to the first and second embodiments, except that the cylindrical central magnets 20 (used in the semi-circular end sections of the first embodiment 10, or as the single center magnet of the second embodiment 110) are replaced with a plurality of smaller magnets 220 arranged in a circle about axis of symmetry 228. Replacing the cylindrical magnet with a plurality of smaller magnets 220 makes it easier to balance the resulting magnetic field and reduces magnetic field distortion resulting from excessively high flux levels in the target material near the center of the cylindrical central magnet.

This completes the detailed description of the preferred embodiments of the sputtering magnet assembly 10 according to the present invention. While a number of specific components were described above for the preferred embodiments of this invention, persons skilled in this art will readily recognize that other substitute components or combinations of components may be available now or in the future to accomplish comparable functions to sputtering magnetron apparatus according to this invention. For example, numerous target materials and sizes may be sputtered according to the present invention, and the above-described method for calculating the relative sizes and configurations of the target material and magnetic shunt can be used for most common target sizes. Likewise, myriad configurations for the plasma-confining magnetic field are possible and the magnetic shunt could be used with such other field configurations, provided the magnetic shunt is configured to provide a lower energy pathway for the excess magnetic flux. Accordingly, and the present invention should not be regarded as limited to the particular target and magnetic field configurations shown and described herein.

Other possible substitutes have been mentioned throughout this description, and many more equivalents are possible. For example, the magnet assembly 10 according to the present invention is not limited to permanent magnets and an equivalent alternative would be to use electromagnets, or a combination of electromagnets and permanent magnets, such as disclosed by Boys et al. or Abe et al. Therefore, it would be feasible to someone having ordinary skill in the art, in light of this disclosure, to assemble the necessary components to practice this invention, regardless of whether some of such components might not be the same as those described herein.

Consequently, the foregoing is considered illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to as falling within the scope of the invention as defined by the claims which follow.

The embodiments of the invention in which an exclusive property or privilege is claimed are defined as follows:

1. A magnet assembly for sputtering a magnetic target in a planar magnetron sputtering apparatus, the target having a saturation magnetization, a front surface, a body, and a back surface, said magnet assembly being positioned adjacent the back surface of the target and generating a magnetic field having sufficient strength to produce a plasma-confining magnetic tunnel over the front surface of the target, said magnetic field being characterized by magnetic flux, some of which is interior to the target, and some of which is exterior to the target and defines a sputtering region adjacent the front surface of the target, said magnet assembly also including a magnetic shunt having a saturation magnetization, said magnetic shunt being positioned a spaced distance from the back surface of the target to provide an alternate path for excess magnetic flux liberated by erosion of the target, the alternate path having less magnetic resistance than most paths exiting the front surface of the target into the sputtering region and back into the front surface of the target, whereby most of said excess magnetic flux is prevented from exiting the front surface of the target into the sputtering region and back into the target as the front surface of the target erodes by sputtering, wherein the thickness of the target multiplied by the saturation magnetization of the target is about equal to the thickness of said magnetic shunt multiplied by the saturation magnetization of said magnetic shunt.

2. The magnet assembly of claim 1, wherein the spaced distance between said magnetic shunt and the back surface of the target is in the range of about 0.025 cm to 0.100 cm.

3. The magnet assembly of claim 2, wherein the width of said magnetic shunt is in the range of about 10-90 times the width of the spaced distance between said magnetic shunt and the back surface of the target.

4. The magnet assembly of claim 1, wherein the target is circular and has an axis of symmetry and wherein said magnetic shunt comprises a circular ring concentric with the axis of symmetry of the circular target.

5. The magnet assembly of claim 4, further comprising:
   a circular magnetically permeable base pole piece having an axis of symmetry aligned with the axis of symmetry of the circular target and substantially parallel to the back surface of the target;
   a central magnet mounted to the center of said base pole piece having a north-south magnetic orientation that is substantially perpendicular to the back surface of the target;
   an outer magnet mounted to the outer periphery of said base pole piece, concentric with said central magnet and said magnetic shunt, said outer magnet being positioned so that said magnetic shunt is substantially between said outer magnet and said central magnet, said outer magnet having a north-south magnetic orientation that is substantially perpendicular to the back surface of the target and opposite the magnetic orientation of said central magnet.

6. The magnet assembly of claim 1, wherein the target is rectangular and includes a longitudinal axis and a transverse axis, said magnet assembly including a linear center section and two end sections, said linear section being aligned with the longitudinal axis of the target, and wherein said magnetic shunt comprises two substantially linear sections disposed in parallel, spaced-apart relation on opposite sides of the longitudinal axis of the rectangular target, the respective parallel linear sections of said magnetic shunt being joined at either end by respective substantially semi-circular end sections.

7. The magnet assembly of claim 6, further comprising:
   an elongated magnetically permeable base pole piece having an elongated center section and two semi-circular end sections, the elongated center section of said base pole piece being aligned with the longitudinal axis of the rectangular target and substantially parallel to the back surface of the rectangular target;

a central magnet assembly mounted to the center of said base pole piece, said central magnet assembly including an elongated center magnet that is aligned with the longitudinal axis of the rectangular target, a first cylindrical magnet disposed at one end of said elongated center magnet, and a second cylindrical magnet disposed at the other end of said elongated center magnet, said elongated center magnet and said first and second cylindrical magnets having north-south magnetic orientations that are substantially perpendicular to the back surface of the target;

a plurality of outer magnets mounted to the outer periphery of said base pole piece, each of said outer magnets being substantially equidistant from said central magnet assembly and said magnetic shunt, and wherein each of said outer magnets has a north-south magnetic orientation that is substantially perpendicular to the back surface of the target and opposite the magnetic orientation of said central magnet assembly.

8. A magnetron sputtering cathode for sputtering a target, the target having a front surface, a body, and a back surface, comprising:

a generally plate-shaped pole piece defining a plane and comprising a magnetically permeable material;

first magnet means positioned on said pole piece and having a north-south magnetic orientation that is substantially perpendicular to said plane;

second magnet means positioned on said pole piece a spaced distance from said first magnet means and having a north-south magnetic orientation that is substantially perpendicular to said plane and substantially opposite the magnetic orientation of said first magnet means, said first and second magnet means being spaced to produce a magnetic field having a strength sufficient to produce a plasma-confining magnetic tunnel over the front surface of the target, the magnetic field being characterized by magnetic flux, some of which is interior to the target and some of which is exterior to the target and defines a sputtering region adjacent the front surface of the target; and magnetic shunt means positioned between said first magnet means and said second magnet means, substantially parallel to said plane and closely adjacent the back surface of the target so that a gap exists between said magnetic shunt means and the back surface of the target, said magnetic shunt means providing an alternate path for excess magnetic flux liberated by erosion of the target, the alternate path having less magnetic resistance than most paths exiting the front surface of the target into the sputtering region and back into the front surface of the target, whereby most of said excess magnetic flux is prevented from exiting the front surface of the target into the sputtering region and back into the target as the front surface of the target erodes by sputtering, wherein said magnetic shunt means comprises magnetically permeable material having a saturation magnetization, a width, and a thickness, and wherein the saturation magnetization of said magnetically permeable material multiplied by the thickness of said magnetically permeable materials is about equal to the saturation magnetization of the target multiplied by the thickness of the target.

9. The magnetron sputtering cathode of claim 8, wherein the gap between said magnetic shunt means and the back surface of the target is in the range of about 0.025 cm to 0.100 cm.

10. The magnetron sputtering cathode of claim 6, wherein the width of said magnetically permeable material is in the range of about 10–90 times the width of the gap between said magnetic shunt means and the back surface of the target.

11. The magnetron sputtering cathode of claim 10, wherein said magnetically permeable material is soft iron.

12. The magnetron sputtering cathode of claim 10, wherein said magnetically permeable material is Permalloy.

13. The magnetron sputtering cathode of claim 10, wherein said magnetically permeable material is nickel. region.

14. A method for optimizing the position of a magnetic shunt in relation to a magnet assembly for sputtering a magnetic target in a planar magnetron sputtering apparatus, the target having a front surface, a body, and a back surface, and said magnet assembly having first magnet means and second magnet means positioned a spaced distance from the first magnet means, said first and second magnet means producing a magnetic field having sufficient strength to produce a plasma-confining magnetic tunnel over the front surface of the target, said magnetic field being characterized by a plurality of magnetic flux lines that define a plasma-confining magnetic tunnel adjacent the front surface of the target and within the target body, said plasma-confining magnetic tunnel having a central axis on either side of which lateral forces exerted on electrons in the plasma are in substantially opposite directions, so that the sum of the lateral forces exerted on electrons at the central axis is substantially zero, comprising the steps of:

determining the location of the central axis of the plasma-confining magnetic tunnel;

adjusting the relative positions of said first magnet means and said second magnet means to move the central axis of the plasma-confining magnetic tunnel to a position substantially midway between said first magnet means and said second magnet means;

positioning a magnetic shunt adjacent the back surface of the target and substantially midway between said first magnet means and said second magnet means;

determining a size of a region immediately adjacent the front surface of the target and within the target body wherein said magnetic flux lines are substantially parallel to the front surface of the target; and moving the magnetic shunt to maximize the size of the region wherein the magnetic flux lines are substantially parallel to the front surface of the target.

* * * * *

UNITED STATES PATENT AND TRADEMARK OFFICE
CERTIFICATE OF CORRECTION

PATENT NO. : 5,415,754
DATED : May 16, 1995
INVENTOR(S) : Barry W. Manley

It is certified that error appears in the above-identified patent and that said Letters Patent is hereby corrected as shown below:

In column 11, line 6, delete "orientation" and insert --orientations--.

In the Claims:

Claim 10, column 18, line 1, delete "6" and insert --9--.

Claim 13, column 18, line 3, delete "region".

Signed and Sealed this

Eighteenth Day of July, 1995

Attest:

BRUCE LEHMAN

Attesting Officer      Commissioner of Patents and Trademarks